United States Patent [19]
Nakazawa et al.

[11] Patent Number: 5,948,577
[45] Date of Patent: Sep. 7, 1999

[54] COLOR FILTER SUBSTRATE, LIQUID CRYSTAL DISPLAY DEVICE USING THE SAME AND METHOD OF MANUFACTURING COLOR FILTER SUBSTRATE

[75] Inventors: Koichiro Nakazawa, Tokyo; Katsuhiro Shirota, Kawasaki; Takeshi Miyazaki, Ebina; Akio Kashiwazaki, Yokohama; Masashi Hirose, Tokyo, all of Japan

[73] Assignee: Canon Kabushiki Kaisha, Tokyo, Japan

[21] Appl. No.: 09/086,520

[22] Filed: May 29, 1998

[30] Foreign Application Priority Data

Jun. 2, 1997 [JP] Japan .................................. 9-142845

[51] Int. Cl.⁶ .......................... G02B 5/20; G02F 1/1335
[52] U.S. Cl. ............................. 430/7; 430/321; 427/162; 427/164; 349/106
[58] Field of Search ................... 430/7, 321; 349/106; 427/162, 164

[56] References Cited

U.S. PATENT DOCUMENTS

| | | | |
|---|---|---|---|
| 5,552,192 | 9/1996 | Kashiwazaki et al. | 427/492 |
| 5,645,963 | 7/1997 | Chang | 430/7 |
| 5,712,064 | 1/1998 | Miyazaki et al. | 430/7 |
| 5,716,739 | 2/1998 | Kashiwazaki et al. | 430/7 |
| 5,716,740 | 2/1998 | Shiba et al. | 430/7 |
| 5,726,724 | 3/1998 | Shirota et al. | 349/106 |
| 5,736,278 | 4/1998 | Nakazawa et al. | 430/7 |

FOREIGN PATENT DOCUMENTS

| | | |
|---|---|---|
| 59-075205 | 4/1984 | Japan . |
| 4-123007 | 4/1992 | Japan . |
| 04-151604 | 5/1992 | Japan . |
| 6-118217 | 4/1994 | Japan . |

*Primary Examiner*—John A. McPherson
*Attorney, Agent, or Firm*—Fitzpatrick, Cella, Harper & Scinto

[57] ABSTRACT

The present invention provides a color filter substrate including a color filter formed by patterning a colored resist, and a color filter formed by an ink jet method, and a liquid crystal display device having the color filter substrate. A method of manufacturing the color filter substrate includes the steps of forming a color filter by using a colored resist, and forming a color filter by an ink jet method.

14 Claims, 3 Drawing Sheets

COLOR FILTER SUBSTRATE, LIQUID CRYSTAL DISPLAY DEVICE USING THE SAME AND METHOD OF MANUFACTURING COLOR FILTER SUBSTRATE

BACKGROUND OF THE INVENTION

1. Field of the Invention

The present invention relates to a color filter substrate used for a liquid crystal display device and the like, a liquid crystal display device using the same, and a method of manufacturing a color filter substrate.

2. Description of the Related Art

A liquid crystal display device is generally provided on a personal computer, a word processor, an automobile navigation system, a small television, and the like, and demand for liquid crystal display devices has recently increased. In expansion of the market of liquid crystal display devices, contents of requirements for color filters include performances such as high definition, large size, high quality, and low cost.

A color filter substrate for such a liquid crystal display device comprises red, blue and green filters provided on a transparent substrate. In order to increase display contrast, a light shielding layer comprising chromium or the like is generally provided in the boundaries between the respective filters. At present, in order to improve the luminance of the liquid crystal display device, means for increasing the aperture of the light shielding layer for each of pixels is provided.

An example of such means is means in which the width of the light shielding layer in each of the boundaries between the adjacent filters is decreased to the limit to increase the aperture area. Although the light shielding layer is formed in a somewhat large shape due to the margin for combining the color filter substrate and an active element array substrate, in another example of means, the light shielding layer is provided on the active element array substrate side to increase the aperture for pixels.

In this way, various means for increasing the aperture of the light shielding layer are provided for increasing the luminance of the liquid crystal display device, but an increase in the aperture of the light shielding layer is accompanied with a decrease in width of the light shielding layer. Similarly, an increase in definition also causes a decrease in width of the light shielding layer.

On the other hand, as a method of manufacturing the color filter substrate, an ink-jet manufacturing method which enables a cost reduction has been proposed. Although this method comprises applying an ink to the predetermined region to form a filter of each of colors, filters of multiple colors can be obtained by the same process. However, since a plurality of color inks are simultaneously applied to the substrate, inks of different colors are mixed to possibly produce color mixing, thereby sometimes causing the problem of deteriorating yield.

A method of preventing color mixing of inks is proposed in Japanese Patent Laid-Open No. 59-75205, in which in order to prevent diffusion of ink into regions other than colored regions, a partition is formed in the boundaries between adjacent filters by photolithography. Other methods are proposed in Japanese Patent Laid-Open Nos. 4-123007 and 4-151604, in which the partition is provided with an oil-repellent and water-repellent effect. In these methods, the partition is formed by laminating a silicone rubber layer on the light shielding layer so as to prevent color mixing of different color inks on the light shielding layer. This partition prevents color mixing of inks which is caused in the coloring step of the ink jet process.

Even in the above ink-jet method of manufacturing a color filter substrate, an increase in the aperture ratio of the light shielding layer causes the need to decrease the width of the partition, thereby deteriorating the effect of preventing color mixing. The method of forming a silicone rubber layer as the partition requires many steps such as the deposition step, the exposure step and the development step for the silicone rubber layer, and the development step of removing the silicone rubber after application of inks, thereby causing an increase in cost. Therefore, the cost reducing effect of the ink jet method cannot effectively be utilized. There is also a problem in that the silicone rubber layer cannot completely be peeled.

SUMMARY OF THE INVENTION

Accordingly, it is an object of the present invention to solve the above problems, and provide a color filter substrate capable of preventing color mixing to satisfy the requirement for high definition, a liquid crystal display device using the color filter substrate and a manufacturing method therefor.

In accordance with one aspect of the present invention, there is provided a color filter substrate comprising a color filter formed by patterning a colored resist, and a color filter formed by the ink jet method, both of which are formed on the substrate.

In accordance with another aspect of the present invention, there is provided a liquid crystal display device comprising the color filter substrate having an electrode, a counter substrate having a electrode opposite to the color filter substrate, and a liquid crystal compound which fills the space between the color filter substrate and the counter substrate.

In accordance with a further aspect of the present invention, there is provided a method of manufacturing a color filter substrate comprising the steps of forming a color filter on a substrate by using colored resist, and forming a color filter by the ink jet method.

Further objects, features and advantages of the present invention will become apparent from the following description of the preferred embodiments with reference to the attached drawings.

DESCRIPTION OF THE PREFERRED EMBODIMENT

Figure 1A:
FIG. 1, which consists of FIGS. 1A, 1B, 1C and 1D, is a drawing showing an example of the process for manufacturing a color filter substrate of the present invention.
Figure 1B:
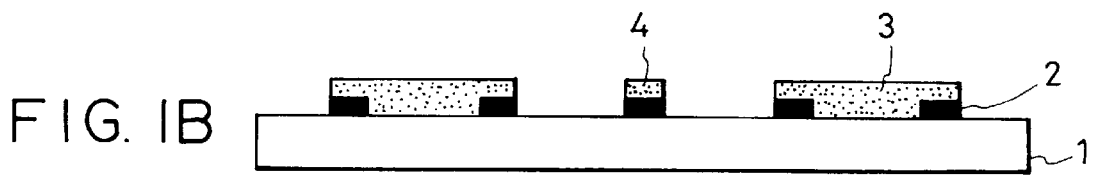
Figure 1C:
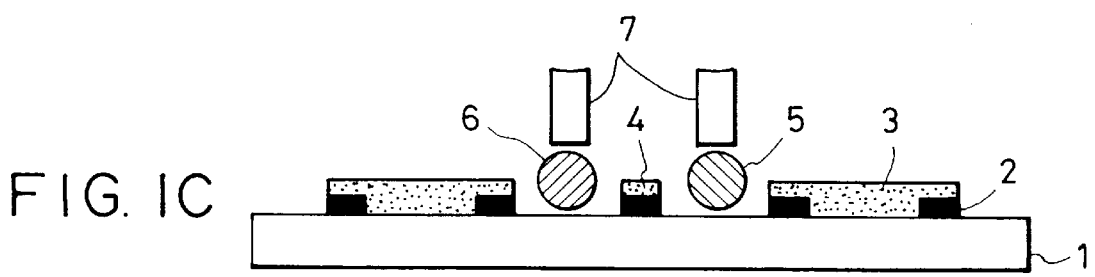
Figure 1D:
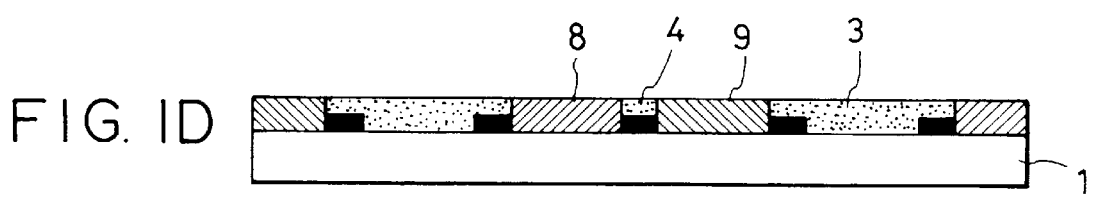

FIG. 1 a schematic sectional view showing the steps of a method of manufacturing a color filter substrate in accordance with an embodiment of the present invention. FIGS. 1(a) to 1(d) are sectional views respectively corresponding to the steps a to d below.

Step-a

On a transparent substrate 1 is formed a light-shielding black matrix 2. Although a glass substrate is generally used as the transparent substrate 1, the substrate is not limited as long as the substrate satisfies requirements for a color filter substrate, such as transparency, mechanical strength, etc.

The black matrix 2 comprises a metal film or metal oxide film of chromium or aluminum, or a resin film containing a photographic emulsion and a colorant such as a pigment, a dye, or the like. The black matrix comprising a metal film of chromium or the like is formed by forming a metal film on the substrate by evaporation or the like, and then patterning the metal layer by photolithography using a photoresist and etching. On the other hand, in the method using a photosensitive resin containing a pigment or the like dispersed therein, a photosensitive resin layer containing a pigment dispersed therein is formed on the substrate by coating, printing or the like, followed by pattern exposure and development to form a light shielding layer. In such a light shielding layer, the optical density per micrometer of thickness is preferably 2.5 or more in order to obtain high shielding performance. The thickness of the black matrix comprising the metal layer is preferably 0.05 to 0.30 μm, and the black matrix comprising a resin is preferably 0.5 to 5.0 μm.

Step-b

Next, a partition 4 and a color filter 3 of a first color are formed in the predetermined regions by using a colored resist. Although methods of forming the partition 4 and the color filter 3 by using the colored resist include photolithography, printing, transfer, electrodeposition, etc., the method is not limited to these methods. A material suitable for one of the methods may be selected for carrying out it. For example, in photolithography, any commercial photosensitive resin having high transparency can be used as the photosensitive resin for the colored resist. However, from the viewpoints of ease of etching, dispersibility of a pigment, heat resistance, solvent resistance, etc., copolymers composed of acrylic monomers are preferred. Preferred examples of such copolymers include copolymers of monomers such as N,N-dimethylolacrylamide, N,N-dimethoxymethylacrylamide, N,N-diethoxymethylacrylamide, N,N-dimethylolmethacrylamide, N,N-dimethoxymethylmethacryalamide, N,N-diethoxymethylmethacryalamide, and the like, and other vinyl monomers. Examples of such vinyl monomers include acrylic acid; methacrylic acid; acrylates such as methyl acrylate, ethyl acrylate, and the like; methacrylates such as methyl methacrylate, ethyl methacrylate, and the like; vinyl monomers containing hydroxyl groups, such as hydroxymethyl methacrylate, hydroxyethyl methacrylate, hydroxymethyl acrylate, hydroxyethyl acrylate, and the like; other ninyl monomers such as styrene, -methylstyrene, acrylamide methacrylamide, acrylonitrile, arylamine, vinylamine, vinyl acetate, vinyl propionate, and the like. Of course, compolymers are not limited to these copolymers. In order to achieve photocuring, any one of various photocurable resins and photopolymerization initiators may further be added.

The thickness of the color filter formed by using the colored resist is preferably 0.5 to 3.0 μm.

From the viewpoint of the anti-color mixing effect, the partition 4 is preferably at least 0.8 μm higher than the substrate 1.

In the present invention, as the color of the color filter formed by using the colored resist, any color may be used. However, in order to provide the function to support the black matrix 2, a color having the highest optical density (400 nm to 700 nm) is preferable. Since the color filter is generally composed of filters of the three colors including red, green and blue, blue among these colors is most preferable.

Step-c

In order to form filters of the second and third colors by the ink jet method, curable inks 5 and 6 are respectively applied to predetermined regions. Each of the inks 5 and 6 is injected from a nozzle 7 of an ink jet recording apparatus. In a case in which the filter 3 formed at the same time as the partition 4 is blue, red and green inks are applied. As the curable ink used for each of the color filters, any ink containing a dye or pigment may be used, but an ink contains a component which can be cured by light irradiation, heating or both treatments. As such a curable component, various resins, and curing agents may be used, and the curable component is not limited as long as it causes no problem such as fixing or the like in ink. Specifically, acrylic monomers, epoxy monomers, melamine monomers, and the like are preferably used. Particularly, acrylic monomers are preferred. Examples of monomers contained in ink include N-methylolacrylamide, N-methoxymethylacrylamide, N-ethoxymethylacrylamide, N-isopropoxymethylacrylamide, N-methylolmethacryalamide, N-methoxymethylmethacrylamide, N-ethoxymethylmethacrylamide, N,N-dimethylacrylamide, N,N-dimethoxymethylacrylamide, N,N-diethoxymethylacrylamide, N,N-dimethylolmethacylamide, N,N-dimethoxymethylmethacrylamide, N,N-diethoxymethylmethacrylamide, and the like. However, the monomer is not limited to these monomers.

The mixing ratio of the monomer is preferably 0.5 to 30 parts by weight relative to 100 parts by weight of ink. The dye or pigment contained in ink is preferably 0.1 to 15% by weight. As a dispersing medium for ink, water, a water-soluble organic solvent or a mixture thereof may be used.

As the ink jet method used in Step-c, a bubble jet type using a thermoelectric converter as an energy generator, a piezo jet type using a piezo element, or the like may be used.

Step-d

Each of the inks is cured by light irradiation, heating or both treatments according to the curability of the curable inks to form color filters 8 and 9.

In the present invention, the color filter of the first color is formed by curing the colored resist, as described above. Therefore, the formation of the color filters of the second and third colors by the ink jet method has the low probability of producing color mixing.

Figure 2:
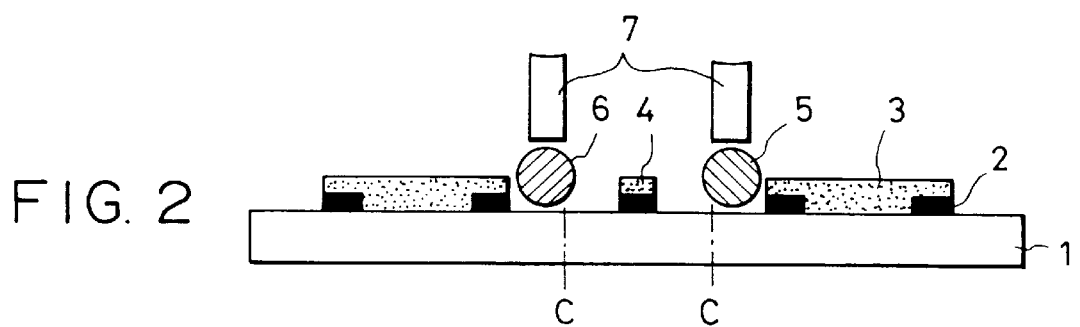
FIG. 2 is a drawing showing an example of the process for manufacturing a color filter substrate of the present invention by the ink jet method.

Since each of the inks 5 and 6 can be applied to a portion of the ink application region nearer the color filter 3 than the center thereof to form the color filter of each of the second and third colors, as shown in FIG. 2, there is substantially no probability of color mixing.

Figure 3:
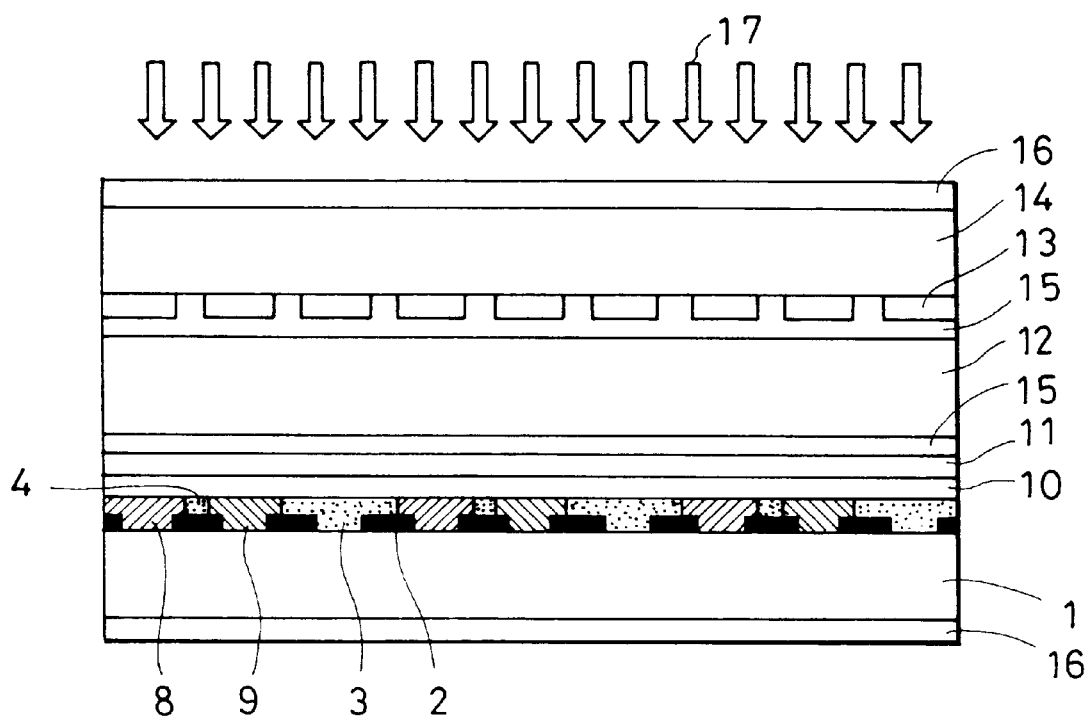
FIG. 3 is a drawing showing an example of a liquid crystal display device using a color filter substrate of the present invention.

FIG. 3 is a sectional view of a TFT color liquid crystal panel into which the color filter of the present invention is incorporated.

The color liquid crystal panel is formed by combining color filters 3, 8 and 9 and a counter substrate 14, and sealing a liquid crystal compound 14 therebetween. On the inside of one of the substrates of the liquid crystal panel are formed TFT (not shown in the drawing) and transparent pixel electrodes 13 in a matrix. On the inside of the other substrate are provided the color filters 3, 8 and 9 opposite to the pixel electrodes 13, and a protective layer 10 and a transparent counter (common) electrode 11 being further formed on the color filters 3, 8 and 9. On the inside of either substrate is formed an alignment film 15 which is rubbed to align liquid crystal molecules in a predetermined direction. On the outside of either glass substrate is bonded a polarizer 16, the space (about 2 to 5 µm) between both glass substrates being filled with the liquid crystal compound. As a back light 17, a combination of a fluorescent lamp and a scattering plate (both of which are not shown in the drawing) may be used. The liquid crystal compound functions as a light shutter for changing the transmittance of light of the back light 17 to perform display.

Figure 4:
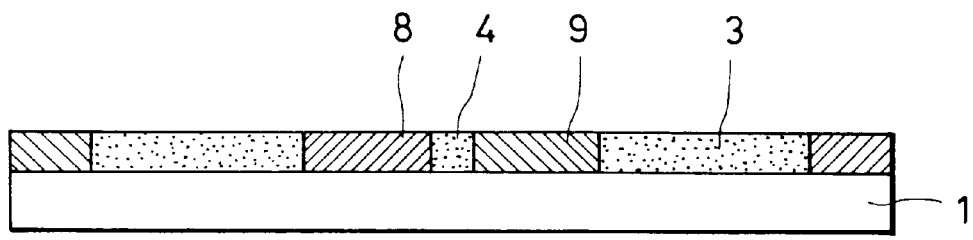
FIG. 4 is a drawing showing another example of a color filter substrate of the present invention.

Although the color filter substrate having the black matrix 2 formed on the substrate 1 is described above with reference to FIGS. 1(a) to (d), the color filter substrate of the present invention may not have the black matrix 2, as shown in FIG. 4. Such a color filter substrate of the present invention can be produced by the same method as FIG. 1 except the step shown in FIG. 1(a) is not carried out.

In a liquid crystal panel comprising the color filter substrate without the black matrix 2, the black matrix 2 is provided on an active element array substrate side. Namely, the color filter substrate without the black matrix 2 is used for a liquid crystal panel of a so-called BM (Black Matrix) on array type.

Figure 5:
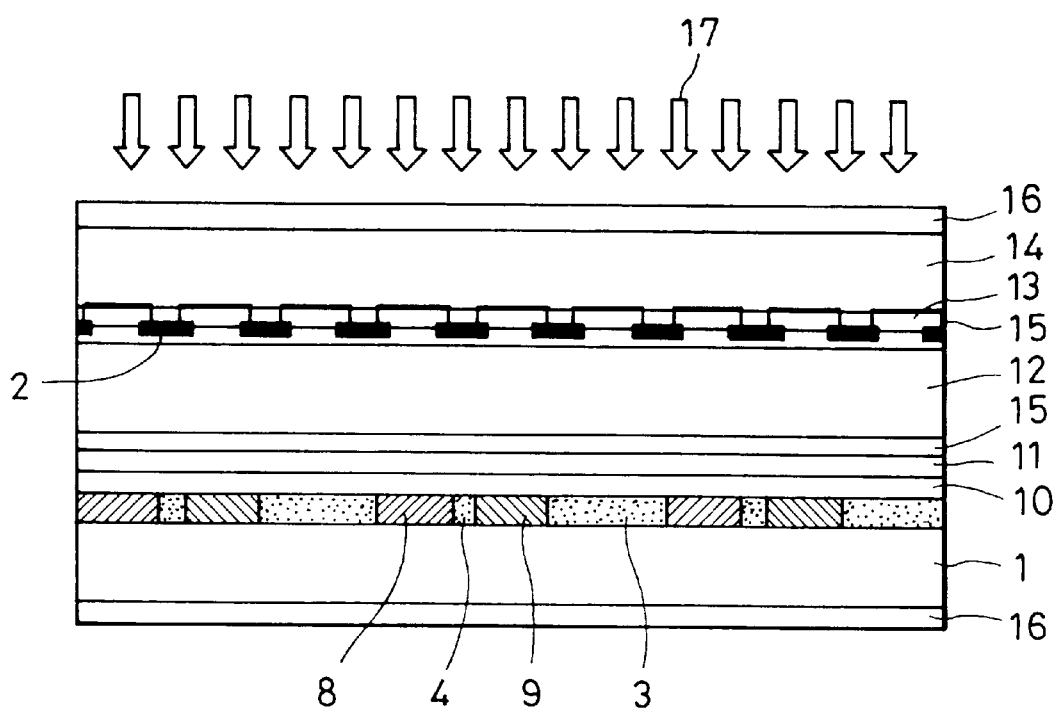
FIG. 5 is a drawing showing another example of a liquid crystal display device using a color filter substrate of the present invention.

FIG. 5 shows an example of the BM on array type liquid crystal panel. In FIG. 5, the same members as FIG. 3 are denoted by the same reference numerals.

EXAMPLES

Example 1

A non-alkali glass substrate having a polished surface and a thickness of 1.1 mm was washed and dried, and chromium was deposited to a thickness of 0.15 µm on the substrate and patterned by photolithography to form a matrix pattern corresponding to the pattern of a color filter. A blue photosensitive resin composition having the composition below was coated on the black matrix and the glass substrate by a spinner, and then baked at 90° C. for 20 minutes to form a photosensitive resin layer. The blue photosensitive resin composition was obtained as follows.

First, (a) 25 parts by weight of methacrylic acid, (b) 10 parts by weight of hydroxyethyl methacrylate, (c) 15 parts by weight of methyl methacrylate, and (d) 50 parts by weight of butyl methacrylate were dissolved in 250 parts by weight of ethyl cellosolve. To the resultant solution was added 0.8 parts by weight of azobisisobutyronitrile in a nitrogen atmosphere, followed by reaction at 75° C. for 3 hours to obtain a resin. The thus-obtained resin was diluted with ethyl cellusolve so that the resin concentration was 8%. To 100 g of diluted resin were added 10 g of pigment (Pigment blue 15:3 and Pigment violet 23 (95:5)) and 1 g of dispersant, followed by sufficient kneading to form varnish. To 100 g of the thus-formed varnish were added 0.5 g of trimethylolpropane acrylate, 0.04 g of 2-(p-methoxystyryl)-4,6-bis(trichloromethyl)-S-triazine, 0.03 g of 2,2'-bis(2-chlorophenyl) -4,5,4',5'-tetraphenyl-1,2'-biimidazole, and 0.03 g of Ingacure, followed by sufficient stirring to form a photosensitive colored composition.

Then 10% polyvinyl alcohol was coated by the same method as described above, baked at 90° C. for 20 minutes, and then dried. Then development by mask exposure was performed to form a partition and a blue filter having a thickness of 0.9 µm.

Then, red and green inks were applied to between the partition and the blue filter by the ink jet method. As the red pigment of the red ink, a mixture (mixing ratio by weight 75:25) of Pigment red 177 and Pigment yellow 83 was used. As the green pigment of the green ink, a mixture (mixing ratio by weight 90:10) of Pigment green 7 and Pigment yellow 7 was used. Besides the pigment, each of the inks contained water, a water-soluble organic solvent, and a self-crosslinkable thermocurable resin comprising an acryl-silicone graft polymer as a thermocurable component. The content of the thermocurable resin was 3% by weight. After application of the inks, each of the inks was cured by heat treatment at 230° C. for 1 hour to form the color filter substrate shown in FIG. 1.

Example 2

On non-alkali glass was formed a matrix pattern by the same method as Example 1. In a thermoplastic acrylic polymer LC2002 (produced by Sanyo Chemical Industries, Ltd.) was dispersed the same blue pigment as that used in Example. 1, followed by intaglio printing to form a partition and a blue filter having a thickness of 2.5 µm on the glass substrate. Then, the ink was cured at 70° C. for 30 minutes and at 200° C. for 30 minutes.

Red and green filters were then formed by the same ink jet method as Example 1.

Example 3

Example 1 was repeated except that in application of red and green inks, the position of the ink jet nozzle was shifted from the center line C of each of the ink application regions to the blue filter side by 5 µm, as shown in FIG. 2, to form a color filter substrate.

Example 4

Example 1 was repeated except that a red resist was used in place of the blue resist used in Example 1, and that blue and green filters were formed by the ink jet method to form a color filter substrate.

Example 5

Example 1 was repeated except that a green resist was used in place of the blue resist used in Example 1, and that blue and red filters were formed by the ink jet method to form a color filter substrate.

Example 6

Example 1 was repeated except that the black matrix pattern was not formed on the glass substrate to form the color filter substrate shown in FIG. 4.

As a result of examination of the degree of color mixing in the color filter substrate of each of Examples, very low color mixing was observed. Particularly, substantially no color mixing was observed in the color filter substrate of Example 3.

The color liquid crystal display device shown in FIG. 3 comprising the color filter substrate of each of Examples 1, 4 and 5, and the color liquid crystal display device shown in FIG. 5 comprising the color filter substrate of Example 6 were formed. As a result, the display devices comprising the substrates of Examples 4, 5 and 6 had slight red, green and blue tints, respectively, but the levels of tints were allowable in observation. Particularly, the display devices respectively comprising the substrates 1 and 6 could be observed without disorder.

With respect to the color filters formed by using the colored resists at the same time as the partition in Examples 1, 4 and 5, the optical densities (wavelength 400 to 700 nm) of the blue filter of Example 1, the red filter of Example 4 and the green filter of Example 5 were 0.95, 0.81 and 0.74, respectively.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A color filter substrate comprising a color filter formed by patterning a colored resist, and color filters formed by an ink jet method, both of which are formed on a substrate.

2. A color filter substrate according to claim 1, further comprising a black matrix formed on the substrate.

3. A color filter substrate according to claim 2, wherein the black matrix Is made of a metal or a metal oxide.

4. A color filter substrate according to claim 2, wherein the black matrix Is made of a resin.

5. A color filter substrate according to claim 1, wherein the colored resist is blue.

6. A color filter substrate according to claim 1, further comprising a partition formed between the respective color filters formed by the ink jet method.

7. A color filter substrate according to claim 6, wherein the partition is formed by utilizing a colored resist.

8. A liquid crystal display device comprising:

a color filter substrate of claim 1 having an electrode;

a counter substrate having an electrode opposite to the color filter substrate; and a liquid crystal compound filling the space between the color filter substrate and the counter substrate.

9. A liquid crystal display device according to claim 8, wherein the color filter substrate comprises a black matrix.

10. A liquid crystal display device according to claim 8, wherein the counter substrate comprises a black matrix.

11. A method of manufacturing a color filter substrate comprising the steps of:

forming a color filter on a substrate by utilizing a colored resist; and forming a color filter by an ink jet method.

12. A method of manufacturing a color filter substrate according to claim 11, wherein the colored resist is formed into a color filter by photolithography.

13. A method of manufacturing a color filter substrate according to claim 11, wherein the colored resist is formed into a color filter by printing.

14. A method of manufacturing a color filter substrate according to claim 11, wherein the colored resist is formed into a color filter by transfer.

* * * * *

UNITED STATES PATENT AND TRADEMARK OFFICE
CERTIFICATE OF CORRECTION

PATENT NO. : 5,948,577
DATED : September 7, 1999
INVENTOR(S) : KOICHIRO NAKAZAWA ET AL.

It is certified that error appears in the above-identified patent and that said Letters Patent is hereby corrected as shown below:

COLUMN 2

Line 32, "a" should read --an--;
    Line 58, "invention;" should read --invention; and--; and
    Line 61, "invention;" should read --invention.--.

COLUMN 3

Line 2, "1(a) to 1(d)" should read --1A to 1D--;
    Line 48, "dimethoxymethylmethacryalamide," should read --dimethoxymethylmethacrylamide,--;
    Line 49, "diethoxymethylmethacryalamide" should read --diethoxymethylmethacrylamide--; and
    Line 57, "ninyl" should read --vinyl--.

COLUMN 4

Line 29, "N-methylolmethacryalamade," should read --N-methylolmethacrylamade,--; and
    Line 33, "N,N-dimethylolmethacylamide," should read --N,N-dimethylolmethacrylamide,--.

COLUMN 5

Line 17, "FIGS. 1(a) to (d)," should read --FIGS. 1A to 1D,--;
    Line 21, "Fig. 1(a)" should read --FIG. 1A--; and
    Line 52, "cellusolve" should read --cellosolve--.

UNITED STATES PATENT AND TRADEMARK OFFICE
CERTIFICATE OF CORRECTION

PATENT NO. : 5,948,577

DATED : September 7, 1999

INVENTOR(S) : KOICHIRO NAKAZAWA ET AL.

It is certified that error appears in the above-identified patent and that said Letters Patent is hereby corrected as shown below:

<u>COLUMN 7</u>

```
Line 24, "Is" should read --is--; and
Line 26, "Is" should read --is--.
```

Signed and Sealed this

Twentieth Day of June, 2000

Attest:

Q. TODD DICKINSON

*Attesting Officer*      *Director of Patents and Trademarks*